United States Patent
Wuister et al.

(10) Patent No.: US 10,410,914 B2
(45) Date of Patent: Sep. 10, 2019

(54) METHODS FOR PROVIDING LITHOGRAPHY FEATURES ON A SUBSTRATE BY SELF-ASSEMBLY OF BLOCK COPOLYMERS

(71) Applicant: ASML Netherlands B.V., Veldhoven (NL)

(72) Inventors: Sander Frederik Wuister, Eindhoven (NL); Andre Bernardus Jeunink, Bergeijk (NL); Emiel Peeters, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/313,515

(22) PCT Filed: May 13, 2015

(86) PCT No.: PCT/EP2015/060620
§ 371 (c)(1),
(2) Date: Nov. 22, 2016

(87) PCT Pub. No.: WO2015/180966
PCT Pub. Date: Dec. 3, 2015

(65) Prior Publication Data
US 2017/0200638 A1    Jul. 13, 2017

(30) Foreign Application Priority Data
May 28, 2014    (EP) .................................... 14170406

(51) Int. Cl.
*H01L 21/768* (2006.01)
*G03F 7/00* (2006.01)
(Continued)

(52) U.S. Cl.
CPC .......... *H01L 21/76816* (2013.01); *C30B 1/04* (2013.01); *C30B 29/58* (2013.01);
(Continued)

(58) Field of Classification Search
CPC ......... H01L 21/76816; H01L 21/76829; H01L 21/0271; H01L 21/3083; C30B 29/58;
(Continued)

(56) References Cited

U.S. PATENT DOCUMENTS

| | | | | |
|---|---|---|---|---|
| 7,521,094 B1 * | 4/2009 | Cheng | .................... | B82Y 10/00 427/385.5 |
| 8,673,541 B2 * | 3/2014 | Xiao | .................... | G03F 7/0002 430/296 |

(Continued)

FOREIGN PATENT DOCUMENTS

| | | |
|---|---|---|
| WO | 2008/097736 | 8/2008 |
| WO | 2012/175342 | 12/2012 |
| WO | 2012/175343 | 12/2012 |

OTHER PUBLICATIONS

U.S. Appl. No. 61/544,912, filed Oct. 7, 2011 (a related U.S. provisional application for Brizard U.S. Pat. No. 8,956,804 B2), specification.*

(Continued)

*Primary Examiner* — Anita K Alanko
(74) *Attorney, Agent, or Firm* — Pillsbury Winthrop Shaw Pittman LLP (57) ABSTRACT

A method of forming at least one lithography feature, the method including: providing at least one lithography recess on a substrate, the or each lithography recess having at least one side-wall and a base, with the at least one side-wall having a width between portions thereof; providing a self-assemblable block copolymer having first and second blocks in the or each lithography recess; causing the self-assem- (Continued)

blable block copolymer to self-assemble into an ordered layer within the or each lithography recess, the ordered layer including at least a first domain of first blocks and a second domain of second blocks; causing the self-assemblable block copolymer to cross-link in a directional manner; and selectively removing the first domain to form lithography features of the second domain within the or each lithography recess.

20 Claims, 5 Drawing Sheets (51) Int. Cl.
  *C30B 1/04* (2006.01)
  *C30B 29/58* (2006.01)
  *G03F 7/20* (2006.01)
  *G03F 7/30* (2006.01)
  *B81C 1/00* (2006.01)
  *C09K 13/00* (2006.01)
  *G03F 7/004* (2006.01)
  *H01L 21/027* (2006.01)
  *H01L 21/308* (2006.01)

(52) U.S. Cl.
  CPC .......... *G03F 7/0002* (2013.01); *G03F 7/2004* (2013.01); *G03F 7/3021* (2013.01); *G03F 7/70375* (2013.01); *H01L 21/76829* (2013.01); *B81C 1/00031* (2013.01); *B81C 1/00396* (2013.01); *B81C 2201/0149* (2013.01); *C09K 13/00* (2013.01); *G03F 7/0041* (2013.01); *H01L 21/0271* (2013.01); *H01L 21/3083* (2013.01)

(58) Field of Classification Search
  CPC ....... C30B 1/04; G03F 7/0041; G03F 7/3021; G03F 7/70375; G03F 7/2004; B81C 1/00031; B81C 1/00396; B81C 2201/0149; C09K 13/00
  See application file for complete search history.

(56) References Cited

U.S. PATENT DOCUMENTS

| | | | |
|---|---|---|---|
| 8,956,804 B2* | 2/2015 | Brizard | G03F 7/0002 430/285.1 |
| 9,285,676 B2 | 3/2016 | Brizard et al. | |
| 2002/0106580 A1* | 8/2002 | Nitta | G03F 7/0045 430/270.1 |
| 2007/0278179 A1 | 12/2007 | Afzali-Ardakani et al. | |
| 2008/0176767 A1 | 7/2008 | Millward | |
| 2010/0021850 A1* | 1/2010 | Nakamura | G03F 7/0035 430/323 |
| 2010/0068656 A1* | 3/2010 | Yeh | G03F 7/0035 430/323 |
| 2010/0124629 A1* | 5/2010 | Gopalan | C08F 293/005 428/119 |
| 2010/0330498 A1* | 12/2010 | Bae | G03F 7/0035 430/270.1 |
| 2012/0041121 A1 | 2/2012 | Asakawa et al. | |
| 2013/0256263 A1 | 10/2013 | Kihara et al. | |
| 2014/0113232 A1 | 4/2014 | Brizard et al. | |
| 2014/0248439 A1 | 9/2014 | Sato et al. | |
| 2014/0263175 A1* | 9/2014 | Gopalan | C08J 7/04 216/49 |
| 2014/0272711 A1* | 9/2014 | Bristol | G03F 7/2037 430/296 |
| 2014/0299575 A1 | 10/2014 | Brizard et al. | |

OTHER PUBLICATIONS

International Search Report and Written Opinion dated Dec. 17, 2015 in corresponding International Patent Application No. PCT/EP2015/060620.
Miri Park et al., "Block Copolymer Lithography: Periodic Arrays of ~1011 Holes in 1 Square Centimeter," Science, vol. 276, pp. 1401-1404 (May 30, 1997).

* cited by examiner

METHODS FOR PROVIDING LITHOGRAPHY FEATURES ON A SUBSTRATE BY SELF-ASSEMBLY OF BLOCK COPOLYMERS

CROSS-REFERENCE TO RELATED APPLICATIONS

This application is the U.S. national phase entry of PCT patent application no. PCT/EP2015/060620, which was filed on May 13, 2015, which claims the benefit of priority of EP application no. 14170406, which was filed on May 28, 2014, and which is incorporated herein in its entirety by reference.

FIELD OF INVENTION

The present invention relates to methods of forming lithography features on a substrate, by use of self-assembly of block copolymers in a recess provided on the substrate. The methods may be useful for forming contact holes providing access between layers of semiconductor devices.

BACKGROUND

In lithography for device manufacture, there is an ongoing desire to reduce the size of features in a lithographic pattern in order to increase the density of features on a given substrate area. Patterns of smaller features having critical dimensions at nano-scale allow for greater concentrations of device or circuit structures, yielding potential improvements in size reduction and manufacturing costs for electronic and other devices. In projection photolithography, the push for smaller features has resulted in the development of technologies such as immersion lithography and extreme ultraviolet (EUV) lithography.

As an alternative, so-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both projection photolithography and for imprint lithography, it is desirable to provide high resolution patterning of surfaces, either of imprint templates or of other substrates. The use of self-assembly of block copolymers (BCPs) has been considered as a potential method for increasing the feature resolution to smaller dimensions than those obtainable by prior art lithography methods or as an alternative to electron beam lithography for preparation of imprint templates.

BCPs comprise different blocks, each comprising identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable BCP is, for instance, a polymer having covalently linked blocks of polystyrene (PS) monomers (hydrophobic block) and polymethylmethacrylate (PMMA) monomers (hydrophilic block). Other BCPs with blocks of differing hydrophobicity/hydrophilicity may be useful. For instance tri-block copolymers (A-B-C) may also be useful, as may alternating or periodic block copolymers (e.g. $[-A-B-A-B-A-B-]_n$ or $[-A-B-C-A-B-C]_m$ where n and m are integers). The blocks are connected to each other by covalent links in a linear or branched fashion (e.g. star or branched configuration).

Self-assemblable BCPs are compounds useful in nano-fabrication because they may undergo an order-disorder transition on cooling below a certain temperature (order-disorder transition temperature $T_{o/d}$) resulting in phase separation of copolymer blocks of different chemical nature to form ordered, chemically distinct domains with dimensions from tens of nanometers to dimensions which are below 10 nm. The size and shape of the domains may be controlled by manipulating the molecular weight and composition of the different block types of the copolymer. The interfaces between the domains may have line width roughness of the order of 1-5 nm and may be manipulated by modification of the chemical compositions of the blocks of the copolymers.

The feasibility of using thin films of BCPs as self-assembling templates was demonstrated by Chaikin and Register, et al., Science 276, 1401 (1997). Dense arrays of dots and holes with dimensions of 20 nm were transferred from a thin film of poly(styrene-block-isoprene) to silicon nitride substrates.

BCPs may form many different phases upon self-assembly, dependent upon the volume fractions of the blocks, degree of polymerization within each block type (i.e. number of monomers of each respective type within each respective block), the optional use of solvents and surface interactions. When applied in thin films, geometric confinement may pose additional boundary conditions that may limit the phases formed. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled BCPs.

The phase type observed may depend upon the relative molecular volume fractions of the different polymer blocks. For instance, a molecular volume ratio of 80:20 will provide a cubic phase of discontinuous spherical domains of the low volume block arranged in a continuous domain of the higher volume block. As the volume ratio reduces to 70:30, a cylindrical phase will be formed with the discontinuous domains being cylinders of the lower volume block. At 50:50 ratio a lamellar phase is formed. With a ratio of 30:70 an inverted cylindrical phase may be formed and at a ratio of 20:80, an inverted cubic phase may be formed.

Suitable BCPs for use as self-assemblable polymers include, but are not limited to, poly(styrene-b-methylmethacrylate), poly(styrene-b-2-vinylpyridone), poly(styrene-b-butadiene), poly(styrene-b-ferrocenyldimethylsilane), poly (styrene-b-ethyleneoxide), poly(ethyleneoxide-b-isoprene). The symbol "b" signifies "block" Although these are di-block copolymers as examples, it will be apparent to the skilled person that self-assembly may also employ tri-block, tetra-block or other multi-block copolymers.

One prior art method used to guide or direct self-assembly of polymers (such as BCPs) onto substrate surfaces is known as graphoepitaxy. This method involves the self-organization of BCPs guided by topological pre-patterning on the substrate using features constructed of resist (or features transferred from resist onto a substrate surface, or features transferred onto film stacks deposited on the substrate surface). The pre-patterning is used to form an enclosure or "recess" comprising a substrate base and side-walls of resist (or side-walls formed in a film or side-walls formed in the substrate).

Typically, the height of features of a graphoepitaxy template is of the order of the thickness of the BCP layer to be ordered, so may be, for instance, from about 20 nm to about 150 nm.

Lamellar self-assembled BCPs can form parallel linear patterns of lithography features with adjacent lines of the different polymer block domains in the recesses. For instance if the BCP is a di-block copolymer with A and B blocks within the polymer chain, the BCP may self-assemble into an ordered layer in each recess, the layer comprising regularly spaced first domains of A blocks, alternating with second domains of B blocks.

Similarly, cylindrical self-assembled BCPs can also form patterns of lithography features comprising cylindrical discontinuous first domains surrounded by a second continuous domain. For instance, if the BCP is a di-block copolymer with A and B blocks within the polymer chain, the A blocks may assemble into a cylindrical discontinuous domain within a circular recess and surrounded by a continuous domain of B blocks. Alternatively, the A blocks may assemble into cylindrical discontinuous domains regularly spaced across a linear recess and surrounded by a continuous domain of B blocks.

Graphoepitaxy may be used, therefore, to guide the self-organization of lamellar or cylindrical phases such that the BCP pattern subdivides the spacing of the side walls of a recess into domains of discrete copolymer patterns.

In a process to implement the use of BCP self-assembly in nanofabrication, a substrate may be modified with a neutral orientation control layer, as part of the graphoepitaxy template, to induce the preferred orientation of the self-assembly pattern in relation to the substrate. For some BCPs used in self-assemblable polymer layers, there may be a preferential interaction between one of the blocks and the substrate surface that may result in orientation. For instance, for a polystyrene (PS)-b-PMMA block copolymer, the PMMA block will preferentially wet (i.e. have a high chemical affinity with) oxide surfaces and this may be used to induce the self-assembled pattern to lie oriented parallel to the plane of the surface. Normal orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "normal orientation" it is meant that the domains of each block will be positioned side-by-side at the substrate surface, with the interfacial regions between adjacent domains of different blocks lying substantially perpendicular to the plane of the surface.

In a graphoepitaxy template for aligning a di-block copolymer having A and B blocks, where A is hydrophilic and B is hydrophobic in nature, the graphoepitaxy pattern may comprise hydrophobic resist side-wall features, with a neutral orientation base between the hydrophobic resist features. The B domains may preferentially assemble alongside the hydrophobic resist features, with several alternating domains of A and B blocks aligned over the neutral orientation regions between the pinning resist features of the graphoepitaxy template.

Neutral orientation layers may be created by, for instance, use of random copolymer brushes which are covalently linked to the substrate by reaction of a hydroxyl terminal group, or some other reactive end group, with oxide at the substrate surface. In other arrangements for neutral orientation layer formation, crosslinkable random copolymers or appropriate silanes (i.e. molecules with a substituted reactive silane such as a (tri)chlorosilane or (tri)methoxysilane, also known as silyl, end group) may be used to render surfaces neutral by acting as an intermediate layer between the substrate surface and the layer of self-assemblable polymer. Such silane based neutral orientation layers will typically be present as a monolayer whereas crosslinkable polymers are typically not present as a monolayer, and may have a layer thickness of typically less than about 20 nm.

A thin layer of self-assemblable BCP may be deposited onto a substrate, having a graphoepitaxy template as set out above. A suitable method for deposition of the self-assemblable polymer is spin coating, as this process is capable of providing well defined, uniform, thin layers of self-assemblable polymer. A suitable layer thickness for deposited self-assemblable polymer films is approximately about 10 to about 150 nm.

Following deposition of the BCP film, the film may still be disordered or only partially ordered and additional steps may be needed to promote and/or complete self-assembly. For instance, the self-assemblable polymer may be deposited as a solution in a solvent, with solvent removal, for instance by evaporation, required prior to self-assembly.

Self-assembly of BCPs is a process where the assembly of many small components (the BCPs) results in the formation of larger more complex structures (the nanometer sized features in the self-assembled pattern, referred to as domains in this specification). Defects arise naturally from the physics controlling the self-assembly of the polymers. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of graphoepitaxy may greatly reduce defect formation. The Flory-Huggins interaction parameter (chi value), and the degree of polymerisation of the BCP blocks (N value) are parameters of the BCPs which affect the phase separation, and the dimensions with which self-assembly of a particular BCP occurs.

For polymers which undergo self-assembly, the self-assemblable polymer will exhibit an order-disorder temperature $T_{o/d}$. $T_{o/d}$ may be measured by any suitable technique for assessing the ordered/disordered state of the polymer, such as differential scanning calorimetry (DSC). If layer formation takes place below this temperature, the molecules will be driven to self-assemble. Above the temperature $T_{o/d}$, a disordered layer will be formed with the entropy contribution from disordered A/B domains outweighing the enthalpy contribution arising from favourable interactions between neighbouring A-A and B-B block pairs in the layer. The self-assemblable polymer may also exhibit a glass transition temperature $T_g$ below which the polymer is effectively immobilized and above which the copolymer molecules may still reorient within a layer relative to neighbouring copolymer molecules. The glass transition temperature is also suitably measured by DSC.

Defects formed during ordering as set out above may be partly removed by annealing. Defects such as disclinations (which are line defects in which rotational symmetry is violated, e.g. where there is a defect in the orientation of a director) may be annihilated by pairing with other defects or disclinations of opposite sign. Chain mobility of the self-assemblable polymer may be a crucial factor for determining defect migration and annihilation and so annealing may be carried out at temperatures where chain mobility is high but the self-assembled ordered pattern is not lost. This implies temperatures up to a few ° C. below the order/disorder temperature To/d for the polymer.

Ordering and defect annihilation may be combined into a single annealing process or a plurality of processes may be used in order to provide a layer of self-assembled polymer such as BCP, having an ordered pattern of domains of differing chemical types (i.e. of domains of different block types).

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the lithography features of the second domain type. Patterns having parallel cylindrical phase domains can be etched using dry etching or reactive ion etching techniques. Patterns having lamellar phase domains can utilise wet etching techniques in addition to those suitable for the etching of parallel cylindrical phase domains.

Following the breakthrough etching, the pattern of the ordered BCP may be transferred by so-called transfer etching using an etching means which is resisted by the second domain type and so forms recesses in the substrate surface where the surface has been laid bare.

Spacing between lithography features is known as pitch—defined as the width of one repeat unit of the lithography feature (i.e. feature width plus inter-feature spacing). Self-assembly processes using BCPs can be used to produce lithography features with particularly low pitch, typically less than 30-50 nm.

Self-assembly of BCPs is also controlled by the spacing of photo-resist walls and the BCP material thickness. The thickness of the BCP layer within a graphoepitaxy template may be optimised for the formation of distinct domains of type A and type B polymers within regions of the graphoepitaxy template. The placement of the domains of type A and type B polymers within regions of the graphoepitaxy template may be guided by the arrangement of the graphoepitaxy template.

For example, a circular recess may be defined on a substrate surface. A deposited BCP layer may be caused to self-assemble within the circular recess to form distinct domains of polymers. A first type A polymer domain may be formed as a cylinder within a continuous type B polymer domain within the recess. Breakthrough etching may be used to remove the cylindrical type A polymer domain, resulting in the formation of a circular opening. The circular opening may be centrally located within the circular recess and may allow further processing to be carried out on the substrate, such as, for example, etching of the substrate in the region of the circular opening. It will be appreciated that the placement of the opening with respect to the placement of the recess controls the accuracy of the placement of the further processing carried out on the substrate.

It would be useful to be able to construct multiple BCP features on a substrate with a substantially predictable placement.

It is an object of the invention to obviate or mitigate one or more disadvantage associated with the prior art.

SUMMARY OF INVENTION

In accordance with the first aspect of the present invention, there is provided a method of forming at least one lithography feature, the method comprising: providing at least one lithography recess on a substrate, the or each lithography recess comprising side-walls and a base, with the side-walls having a width therebetween; providing a self-assemblable block copolymer having first and second blocks in the or each lithography recess; causing the self-assemblable block copolymer to self-assemble into an ordered layer within the or each lithography recess, the ordered layer comprising at least a first domain of first blocks and a second domain of second blocks; causing the self-assemblable block copolymer to cross-link in a directional manner; and selectively removing the first domain to form lithography features comprised of the second domain within the or each lithography recess.

Causing the self-assemblable block copolymer to cross-link in a directional manner may be interpreted as meaning causing the cross-linking to initiate at a first location and causing the cross-linking to proceed towards a second location. Cross-linking of a block-copolymer in a directional manner allows the placement of domains of the first blocks and the second blocks to be controlled accurately, so as to accurately position the domains (and hence the lithography features) within the lithography recess.

The following features are applicable to the invention where appropriate. When suitable, combinations of the following features may be employed as part of the invention, for instance as set out in the claims. The invention is particularly suitable for use in device lithography. For instance, the invention may be of use in patterning a substrate which is used to form a device, or may be of use in patterning an imprint template for use in imprint lithography (which may then be used to form devices).

The cross-linking may be initiated at the side-walls and proceed away from the sidewalls. The sidewalls provide a convenient location at which to initiate the cross-linking. For example the cross-linking may be initiated by a layer provided on the sidewall, or by a material contained within the side-walls.

The self-assemblable block copolymer may be caused to self-assemble during an annealing process. The self-assemblable block copolymer may be caused to cross-link during an annealing process.

Cross-linking during an annealing process may allow a block copolymer to both self-assembly and cross-link during a single processing step, providing a simple process through which cross-linking can be brought about.

The block copolymer may comprise polystyrene blocks. The polystyrene blocks may comprise glycidyl moieties. Providing glycidyl moieties within the polystyrene blocks allows the polystyrene blocks to be cross-linked by polymerisation of the glycidyl moieties. The glycidyl moieties can readily be caused to polymerise by an acid catalyst.

The polystyrene blocks may comprise more than about 0.1% by weight of glycidyl moieties. The polystyrene blocks may comprise less than about 10% by weight of glycidyl moieties. Preferably the polystyrene blocks comprise more than or equal to about 1% by weight of glycidyl moieties. Preferably the polystyrene blocks comprise less or equal to about 2% by weight of glycidyl moieties.

Causing the self-assemblable block copolymer to cross-link may be initiated by an acid. The acid may be generated by a photo-acid generator. The acid may be at least partially generated by a photo-acid generator during a lithography exposure.

A lithography exposure is an exposure of a substrate to a patterned radiation beam, generally used to transfer a pattern to the substrate. For example, the pattern transferred may be that required to define the lithography recess. The generation of an acid during the lithography exposure is common where chemically amplified resists are used to increase the sensitivity of a photo-resist. Using an acid already generated within a resist to initiate cross-linking allows the acid which is already present (and which has served its primary purpose) to be used for a secondary purpose (i.e. initiating cross-linking).

The acid may be at least partially generated by a photo-acid generator during a flood exposure. Rather than, or in addition to, a patterned lithography exposure, a flood exposure allows an entire substrate to be exposed to radiation. This can allow a photo-acid generator which has not previously been activated to be activated and to generate an acid.

The recesses may be formed in resist. The photo-acid generator may be provided within the resist.

The photo acid generator may be provided on the side-walls of the at least one lithography recess.

The recesses may be formed in the substrate.

The or each lithography recess may be circular. The self-assemblable block copolymer may be adapted to form an ordered layer having cylindrical first domains of the first blocks in a cylindrical arrangement surrounded by a second continuous domain of the second blocks, the cylindrical first domain being oriented perpendicular to the substrate. The use of a circular lithography recess allows the definition of circular lithography features.

Contact holes may be circular openings which allow access between non-adjacent layers on a substrate. A contact hole is an example of a lithography feature. The use of self-assembly of BCPs in a lithography recess to form a contact hole may allow a hole to be formed having a smaller lateral dimension than the dimensions of the lithography recess. The application of this self-assembly technique to the formation of contact holes provides the advantage of reducing the dimension of the contact hole.

The or each lithography recess may be linear. The self-assemblable block copolymer may be adapted to form a lamellar ordered layer wherein the first domains are lamellae alternating with second domains which are also lamellae, the lamellae of the first and second domains being orientated with their planar surfaces lying perpendicular to the substrate and parallel to the recess walls. The use of a linear lithography recess allows the definition of linear lithography features.

The cross-linking may be initiated at the side-walls and proceed towards the centre of the recess.

The or each lithography recess may be used to form contact holes.

The lithography features may have a minimum lateral dimension of about 40 nm or less. The lithography features may have a minimum lateral dimension of about 5 nm or more. The lithography features formed by the self-assembly of BCPs may allow the definition of smaller lithography features than would be defined by conventional lithography methods alone. Alternatively, the use of self-assembly of BCPs may allow the definition of lithography features with more uniformity than would be possible with lithography features defined by conventional lithography techniques at such small dimensions.

In order to direct self assembly and reduce defects, the side-walls may have a higher chemical affinity for one of the BCPs such that, upon assembly, the BCP having the higher chemical affinity with the side-wall is caused to assemble alongside that side-wall. Chemical affinity may be provided by utilising hydrophobic or hydrophilic side-wall features.

The step of providing a layer of self-assemblable BCP in the recess may be carried out by spin coating of a solution of the BCP followed by removal of solvent.

The self-assemblable BCP may be caused to self-assemble by lowering the temperature to a temperature less than To/d for the BCP, to give an ordered layer of self-assembled BCP in the recess.

The substrate may be a semiconductor substrate, and may comprise a plurality of layers forming the substrate. For instance, the outermost layer of the substrate may be an ARC (anti-reflection coating) layer.

The outermost layer of the substrate may be neutral to the domains of the BCP, by which it is meant that it has a similar chemical affinity for each of the domain types of the BCP. The neutral orientation layer may, for example, be created by use of random copolymer brushes. Alternatively, an orientation control layer may be provided as an uppermost or outermost surface layer of the substrate to induce a preferred orientation of the self-assembly pattern in relation to the substrate.

The recesses comprising side-walls may be formed by photolithography, for instance with actinic radiation such as UV, EUV or DUV (deep UV) radiation.

The recesses may for example be formed in resist. The recesses may for example be formed on a substrate surface (e.g. having been transferred from resist onto the substrate). The recess may for example be formed in a film stack (e.g. having been transferred from resist onto the film stack).

The height of the recesses may be of the order of the thickness of the BCP layer to be ordered. The height of the recesses may for example be from about 20 nm to about 150 nm (e.g. about 100 nm).

The step of selectively removing one of the domains may be achieved by etching, wherein the ordered layer of self-assembled BCP acts as a resist layer for etching lithography features within the recess on the substrate. Selective etching can be achieved by utilising polymers having different etch resist properties and by selection of an etchant capable of selectively etching certain of the polymer domains. Selective removal may alternatively be achieved, for instance, by selective photo-degradation or photo-cleavage of a linking agent between blocks of the copolymer and subsequent solubilisation of one of the blocks.

According to a second aspect of the invention there is provided a method for forming a device topography at a surface of a substrate, the method comprising using the self-assembled block copolymer layer formed by the method according to the first aspect of the invention as a resist layer whilst etching the substrate to provide the device topography.

According to a third aspect of the invention there is provided a method of forming at least one lithography feature on a substrate, the substrate comprising at least one lithography recess, the or each lithography recess comprising side-walls and a base, with the side-walls having a width therebetween, the method comprising: providing a self-assemblable block copolymer having first and second blocks in the or each lithography recess; causing the self-assemblable block copolymer to self-assemble into an ordered layer within the or each lithography recess, the ordered layer comprising at least a first domain of first blocks and a second domain of second blocks; causing the self-assemblable block copolymer to cross-link in a directional manner; and selectively removing the first domain to form lithography features comprised of the second domain within the or each lithography recess.

According to a fourth aspect of the invention there is provided a lithographic tool comprising: a heat source arranged to anneal a substrate; and a radiation source arranged to irradiate the substrate during annealing. The provision of a radiation source within a lithographic tool which also comprises a heat source allows a photo acid generator to be activated, so as to initiate cross-linking, at a location which is remote from a lithography exposure location. For example, annealing may be carried out on a wafer track while a substrate is transported within a semiconductor fabrication plant.

The radiation source may be arranged to emit actinic radiation. The radiation source may be arranged to emit UV radiation. The radiation source may be arranged to emit DUV radiation. The radiation source may be arranged to emit EUV radiation. A photo acid generator may be activated by longer wavelength radiation than is required for a lithography exposure. Radiation with a wavelength which is longer than would be required for a lithography exposure can be used as there is no need for a pattern to be transferred by the radiation which activates a photo acid generator.

The heat source may be a hotplate.

The present invention relates to lithography methods. The methods may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. The invention is also of use to create regular nanostructures on a surface for use in the fabrication of integrated circuits, bit-patterned media and/or discrete track media for magnetic storage devices (e.g. for hard drives).

The self-assemblable BCP may be a BCP as set out hereinbefore comprising at least two different block types, referred to as first and second polymer blocks, which are self-assemblable into an ordered polymer layer having the different block types associated into first and second domain types. The BCP may comprise di-block copolymer and/or tri-block or multi-block copolymers. Alternating or periodic BCPs may also be used in the self-assemblable BCP.

In an embodiment the cross-linking is covalent bonding between polymer chains. For example, a functional group within a first polymer chain undergoing a chemical reaction so as to polymerise with a similar functional group within a second polymer chain is considered to be the formation of a cross-link between the first and second polymer chains.

By chemical affinity, in this specification, is meant the tendency of two differing chemical species to associate together. For instance chemical species which are hydrophilic in nature have a high chemical affinity for water whereas hydrophobic compounds have a low chemical affinity for water but a high chemical affinity for alkanes. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as alkanes or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinities of surfaces may be measured, for instance, by means of contact angle measurements using various liquids, so that if one surface has the same contact angle for a liquid as another surface, the two surfaces may be said to have substantially the same chemical affinity for the liquid. If the contact angles differ for the two surfaces, the surface with the smaller contact angle has a higher chemical affinity for the liquid than the surface with the larger contact angle.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the self-assemblable BCP molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis normal to the substrate surface and passing through the centroid of the feature. Thickness may suitably be measured by techniques such as interferometry or assessed through knowledge of etch rates.

Wherever mention is made of a "layer" in this specification, the layer referred to is to be taken to be layer of substantially uniform thickness, where present. By "substantially uniform thickness" is meant that the thickness does not vary by more than 10%, preferably not more than 5% of its average value across the layer.

In this specification "recess" is not intended to imply a particular shape. The term "recess" may be interpreted as meaning a lithography feature formed on the surface of a substrate, which has a depth and side-walls. A recess may for example be circular in shape, for example defining a contact hole, having a diameter or width and having side-walls which, in cross-section, appear vertical. Alternatively, a recess may be linear in shape, for example defining a trench, having side-walls which are separated by a width in a first direction, and extend in an elongate manner in a second direction. It will be appreciated that a recess may take any other convenient form, and may include linear or curved sections. A lithography feature may comprise one or more recesses. The term "lithography recess" may be interpreted as meaning a recess which is intended to result in the production of a lithography feature.

In this specification, the term "substrate" is meant to include any surface layers forming part of the substrate, or being provided on a substrate, such as other planarization layers or anti-reflection coating layers which may be at, or form, the surface of the substrate, or may include other layers such as those specifically mentioned above with reference to particular embodiments of the invention.

In this specification, the term "lateral" may be interpreted as meaning in the plane of the surface of a substrate. For example, the width or diameter of a recess may be considered to be a lateral dimension of that recess. Alternatively, the length of a recess may be considered to be a lateral dimension of that recess. However, the depth of a recess would not be considered to be a lateral dimension of that recess.

One or more aspects of the invention may, where appropriate to one skilled in the art, be combined with any one or more other aspects described herein, and/or with any one or more features described herein. In particular, features described with reference to the first aspect of the invention may be combined with the second and/or third aspects of the invention.

BRIEF DESCRIPTION OF THE DRAWINGS

Specific embodiments of the invention will be described with reference to the accompanying Figures, in which.

DETAILED DESCRIPTION

The described and illustrated embodiments are to be considered as illustrative and not restrictive in character, it being understood that only preferred embodiments have been shown and/or described and that all changes and modifications that come within the scope of the inventions as defined in the claims are desired to be protected.

Figure 1A:
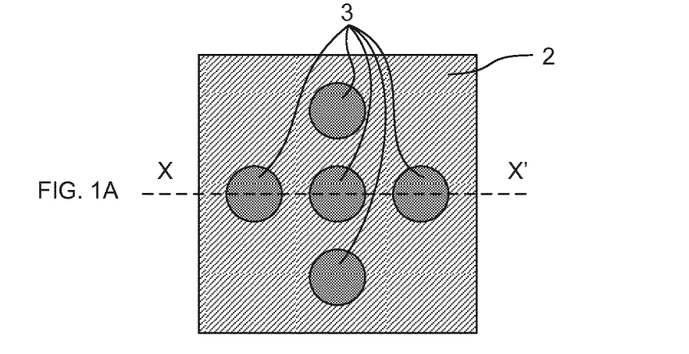
FIGS. 1A-1E schematically depict directed self-assembly of A-B block copolymers onto a substrate by graphoepitaxy.
Figure 1B:
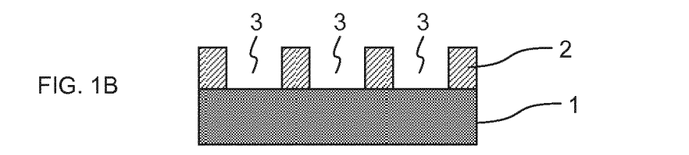

FIGS. 1A and 1B show, in plan view and cross-section respectively, part of a substrate 1 to which a lithography process using self-assembly of BCPs is applied. An anti-reflection coating may be present on the surface of the substrate 1. The anti-reflection coating (if present) may be an organic material, such as, for example, ARC 29, from Brewer Science. Alternatively, the anti-reflection coating may be an inorganic material such as, for example, SiC or SiON. A layer of photo-resist 2 is applied to the substrate 1. The layer of photo-resist 2 is patterned with a plurality of contact hole resist recesses 3.

Figure 1C:
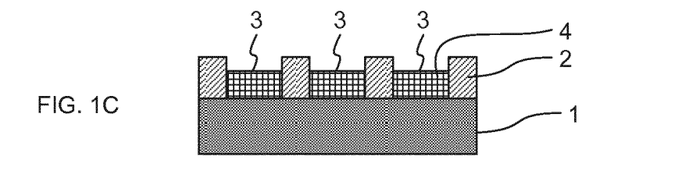
Figure 1D:
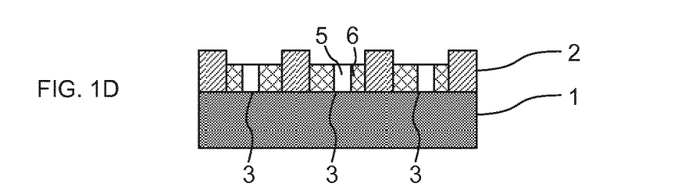
Figure 1E:
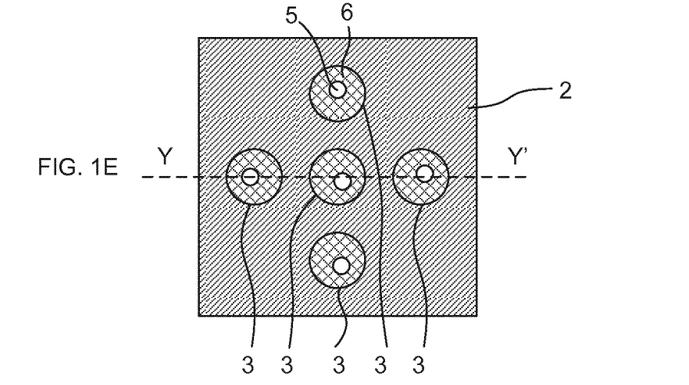

In FIG. 1C, a BCP layer 4 has been deposited onto the substrate 1 and the photo-resist 2. The BCP layer 4 is shown with a uniform thickness within each of the photo-resist recesses 3. It will be appreciated that the BCP layer 4 may also be present on top of the photo-resist 2, although this is not shown. In FIGS. 1D and 1E, which show cross-section and plan views respectively, the BCP layer 4 has been thermally annealed. The thermal annealing process causes the BCP deposited within each of the photo-resist recesses 3 to form distinct domains of polymers. A first type A polymer domain 5 is formed as a cylinder within a continuous type B polymer domain 6 within each of the recesses 3.

The cylindrical type A polymer domains 5 are generally centred within the recesses 3. However, as shown in FIGS. 1D and 1E, it has been realised that the domains 5 may not be accurately centred within the recesses 3. The polymer domains 5 may suffer from random placement errors within the recesses 3. The placement of each polymer domain 5 is confined by the resist sidewalls. However, the random nature of the interactions between polymer chains and resulting phase separation may result in placement errors of the polymer domains 5. Any such placement errors may result from the fact that the energy cost of small displacements is overcome by the thermal energy (kT) present during the annealing process.

The placement of cylindrical A block domains within recesses as guided by directed self-assembly techniques, and as described above, can be simulated using dynamic density function theory (DDFT) methods. Such simulations reveal that the placement error of a cylindrical feature within a recess is related to the length of the BCP blocks.

For example, for a system in which the BCP is PS-b-PMMA the placement error is proportional to the square root of the polystyrene block length. The BCP domains can be modelled as a system of springs, in which the cylindrical A block domain, which is formed from PMMA, is held in place by a spring which is comprised of the polystyrene B block domain.

An effective spring constant which models the action of the polystyrene B block domain can be defined as:

$$K_{spring} = 3kT/Nb^2 \qquad (1)$$

where:
k is the Boltzmann constant;
T is the temperature;
N is the number of monomer units within the respective BCP block (i.e. the degree of polymerization); and
b is a parameter which represents the length of the monomer units within the respective BCP block.

It will be appreciated that if the spring constant is increased, the system will become more rigid (i.e. stiffer), and the movement of the cylindrical A block domain will be more restricted. This will result in lower placement error. It can be seen from equation (1) that the spring constant can be increased by reducing the block length (i.e. by reducing the degree of polymerization).

However, it will also be appreciated that the block length should also be long enough to induce phase separation, as governed by Flory-Huggins theory. Further, the total polymer length (i.e. A and B block) should be sized appropriately to cooperate with the dimensions of the lithography features which are intended to be defined (and also therefore with the dimensions of the graphoepitaxy features).

Alternative methods for increasing the effective spring constant of BCP system would be to change the stiffness of the polymer blocks themselves, or to increase the Flory-Huggins interaction parameter. However, either of these methods would involve altering the BCPs used from those which are well understood (e.g. PS-b-PMMA). Further, any increase in the Flory-Huggins interaction parameter, or increase in polymer block stiffness may well introduce significant processing difficulties, such as, for example, slower kinetics (i.e. slower self-assembly) and an increased number of defects.

As such, it will be appreciated that using known methods it may not be possible to control the phase separation to achieve a predictable placement of each of the polymer domains within the recesses. Therefore, it may not be possible to create graphoepitaxy lithography features using known methods which are positioned with sufficient accuracy to meet critical dimension (CD) and local critical dimension uniformity (LCDU) requirements.

It is therefore desirable to provide a directed self-assembly method which allows improved placement accuracy. Moreover, it is desirable to provide such a method whilst allowing well understood and easily processable BCPs, such as, for example, PS-b-PMMA, to be used.

The present invention overcomes the problem which was illustrated in FIG. 1 in which the placement of the polymer domains 5 within the recesses 3 are subject to significant random variation. This problem is overcome in the method illustrated by FIG. 2 by the use of cross-linking within the BCP. Cross-linking reduces the extent to which the polymer chains within the BCP can move randomly. This reduction in movement in turn reduces the extent to which the domains are randomly located within recesses. Such a reduction in random location of domains is used to ensure that the arrangement of domains is regular and that each domain is accurately positioned within a respective recess.

FIG. 2 shows a process in which a modified BCP is caused to self-assemble. FIGS. 2A and 2B show in plan and cross-section respectively, a substrate 10 on which a layer of photo-resist 11 is provided. The layer of photo-resist 11 is patterned with a plurality of contact hole resist recesses 12.

Figure 2A:
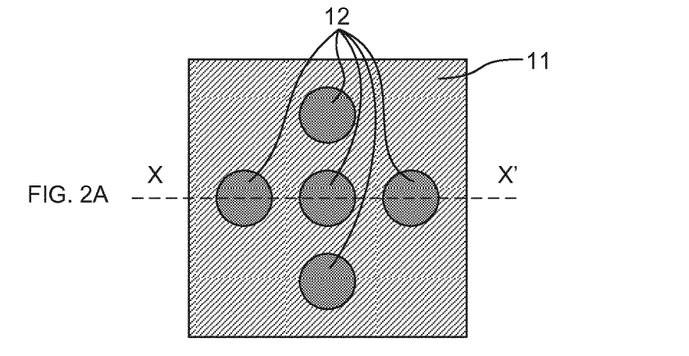
FIGS. 2A-2E schematically depict directed self-assembly of A-B block copolymers onto a substrate by graphoepitaxy according to an embodiment of the invention.
Figure 2B:
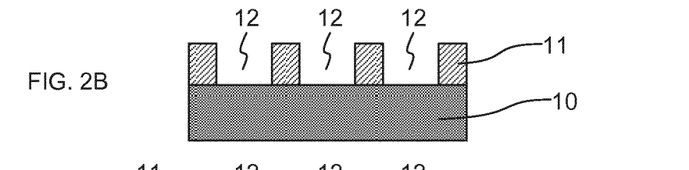
Figure 2C:
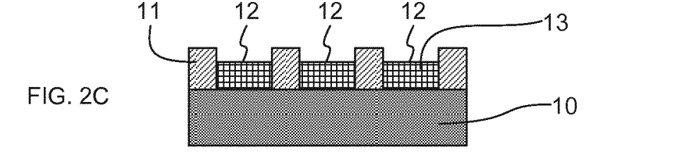

In FIG. 2C, a self-assemblable A-B block copolymer (BCP) layer 13 has been deposited within the recesses 12. The self-assemblable A-B block copolymer is selected to enable a cross-linking between the blocks. For example, the BCP may be similar to PS-b-PMMA, modified so as to introduce a cross-linking group to the PS blocks.

Figure 2D:
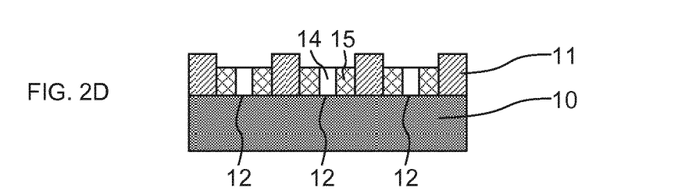
Figure 2E:
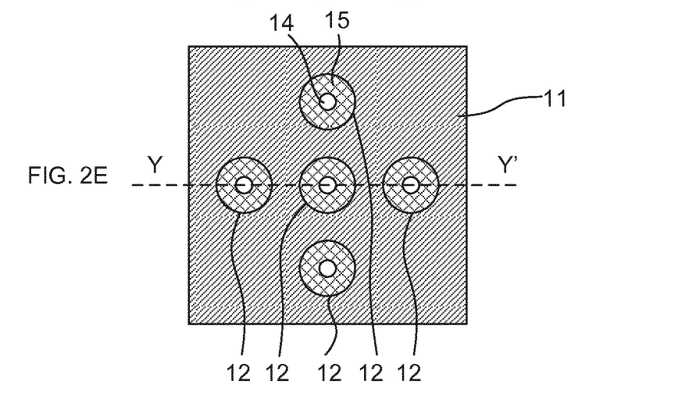

In FIGS. 2D and 2E, the substrate 10 is shown after thermal annealing. The thermal annealing process causes self-assembly of the BCP material. As can be seen within the contact hole resist recesses 12, the BCP material self-assembles to form a domain of A blocks 14 (unhatched) and a domain of B blocks 15 (hatched). The A block domain 14 is in a cylindrical arrangement being surrounded by a continuous the B block domain 15. The cylindrical A block domain 14 is oriented perpendicular to the substrate 10.

In order to prevent the cylindrical A block domains 14 from being randomly located within the respective recesses 12 (i.e. to cause the cylindrical A block domains 14 to be accurately located at the centre of the respective recesses 12—as shown in FIGS. 2D and 2E) the BCP is caused to cross-link gradually, with the cross-linking starting at the perimeter of the recesses 12, and proceeding in a directional manner towards the centre of the recesses 12, as described in more detail below.

In subsequent processing steps (not shown) the domains of A blocks 14 can be selectively removed by well known techniques. Such selective removal of A block domains 14 exposes the substrate 10 below the domains of A blocks 14. However, domains of B blocks 15 will not be removed by the process which removed A blocks 14, due to the selectivity of the etching process. In this way, it is possible to remove only regions of type A polymer, with all other areas of the substrate 10 being covered by either B block domains 15, or photo-resist 11.

The remaining B block features may subsequently be used as a mask defining openings which can be etched. For example, contact holes may subsequently be etched in the substrate 10 as defined by the relatively small opening presented by the removed A block domains. This process allows a higher resolution to be achieved than could be achieved by conventional photo-resist patterning techniques, the dimensions of the lithographically defined contact hole resist recesses 12 directing the self-assembly of the BCP to create a smaller region of A block domains 14.

Selective etching is achieved due the relative susceptibility towards etching, with the A blocks being relatively prone to etching, while the B blocks are relatively resistant to etching. Selective removal may also be achieved, for instance, by selective photo-degradation or photo-cleavage of a linking agent between blocks of the copolymer and subsequent solubilisation of one of the blocks. The invention allows for formation, onto substrates, of features which have critical dimensions which are smaller than those of the recesses which direct the self-assembly, allowing features of the order of a few nm to be created with a smallest lithographically defined recess of the order of a few tens of nm. For example, the use of a lithographically defined circular recess having a diameter of about 100 nm may be used to define a contact hole feature having a diameter of about 40 nm. In a further example, the use of a lithographically defined circular recess having a diameter of about 30 nm may be used to define a contact hole feature having a diameter of about 5 nm.

In an embodiment (not illustrated) the etching (or other removal process) may etch into the substrate. Following this the type A domains may be removed, leaving behind a regularly spaced array of lithography features formed in the substrate, with a critical dimension which is smaller than the minimum dimension which can be achieved by the photolithography feature which was used to define the recesses 12.

An example of the process illustrated in FIG. 2 is shown in FIG. 3 in more detail. FIG. 3A shows a substrate 20 on which a layer of photo-resist 21 is provided. A recess 22 is provided at the surface of the substrate 20. The recess 22 has side-walls 22a and a base 22b. The photo-resist layer 21 contains acid molecules 23. For example, the acid molecules 23 may be produced by a photo-acid generator (PAG) which is provided within the photo-resist, the photo-resist being a chemically amplified photo-resist. The use of chemically amplified photo-resists is known in the art to increase the sensitivity of the resist to an exposure dose. The acid molecules 23 may comprise, for example, greater than or equal to about 1% by weight of the photo-resist layer 21. The acid molecules 23 may comprise, for example, less than or equal to about 20% by weight of the photo-resist layer 21. The PAG may have been activated by EUV radiation in an exposure when the recess 22 was defined. Alternatively, or additionally, the PAG may be activated by a flood exposure of radiation at a different wavelength, for example UV or DUV radiation.

The photo-acid generator may be selected from known photo-acid generators. For example, in an embodiment the photo-acid generator may comprise onium salts, such as, for example, triphenylsulfonium salts, sulfonium salts, iodonium salts, diazonium salts or ammonium salts. In alternative embodiments, the photo-acid generator may comprise, for example, 2,6-nitrobenzyl esters, aromatic sulfonates, sulfosuccinimides or di-t-butylphenyl iodonium perfluorobutyl sulfonate.

Figure 3A:
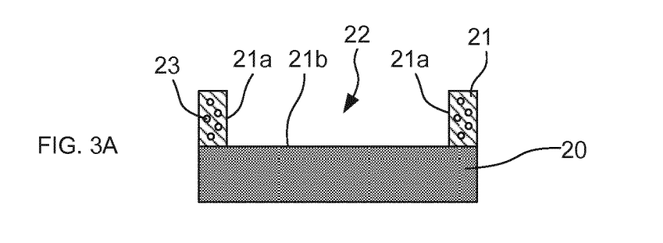
FIGS. 3A-3D schematically depict in more detail the directed self-assembly of A-B block copolymers according to the embodiment of the invention shown in FIGS. 2A-2E.
Figure 3B:
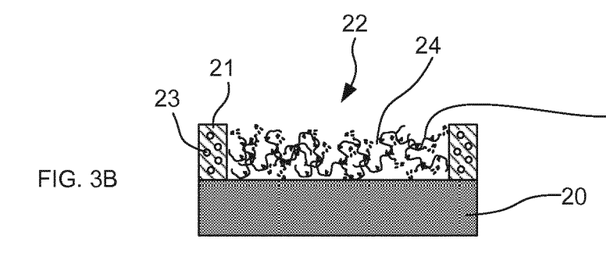

In FIG. 3B, a self-assemblable A-B block copolymer (BCP) layer 24 has been deposited within the recess 22. The BCP is a modified PS-b-PMMA. The PS blocks are modified by the addition of a functional group which allows the BCP to be cross-linked. For example, the functional groups may be acid sensitive cross-linking functional groups.

FIG. 3B' shows schematically a molecule of a BCP modified so as to introduce acid sensitive cross-linking functional groups. The molecule comprises a PS block 24a and a PMMA block 24b. The molecule further comprises acid sensitive cross-linking functional groups 24c which are attached to the PS block 24a.

In an embodiment, the acid sensitive cross-linking functional groups 24c are glycidyl moieties. A small percentage of the glycidyl moieties are included within the PS blocks 24a. This may be achieved, for example, by adding glycidylmethacrylate (GMA) to the PS during synthesis. The resulting BCP may be referred to as PS/PGMA-b-PMMA. When exposed to an acid, the glycidyl moieties within the PS blocks undergo an acid catalysed polymerisation reaction. The polymerisation between the glycidyl moieties causes the PS blocks, within which the glycidyl moieties are distributed, to become cross-linked to one another.

It will be appreciated that the cross-linking functional groups may be functional groups other than glycidyl moieties. For example, the cross-linking functional groups may be epoxide functional groups.

The percentage of glycidyl moieties within the PS blocks may be, for example, less than about 10% by weight. The percentage of glycidyl moieties within the PS blocks may be, for example, greater than about 0.1% by weight. Preferably the percentage of glycidyl moieties within the PS blocks is less than or equal to about 2% by weight. Preferably the percentage of glycidyl moieties within the PS blocks is greater than or equal to about 1% by weight.

The acid catalysed cross-linking is initiated by the acid molecules 23 which are present in the photo-resist layer 21 which were generated in an earlier processing step, as described above.

Figure 3C:
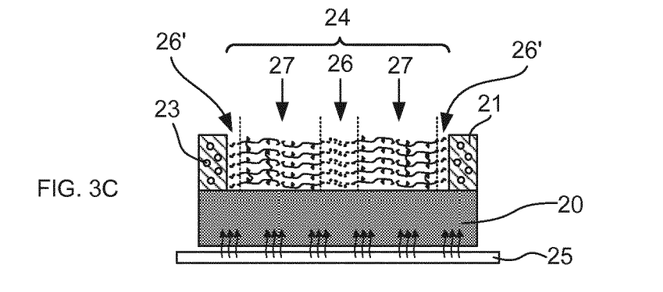

In FIG. 3C the substrate 20 is placed on a hotplate 25 for thermal annealing. The elevated temperature during the annealing step allows the BCP material to self-assemble to form a domain of A blocks 26 and a domain of B blocks 27. The A block domain 26 is in a cylindrical arrangement being surrounded by a continuous the B block domain 27. The cylindrical A block domain 26 is oriented perpendicular to the substrate 27. The domains 26, 27 may be further processed, for example to remove the A block domain, in further processing as described above with reference to FIG. 2.

The self-assembly process occurs at a rate which depends on the properties of the BCP material, and other factors such as, for example, the temperature of the annealing process. The annealing temperature should be above the glass transition temperature Tg but below the order disorder temperature To/d of the BCP.

It is noted that in addition to the A block domain 26 and the B block domain 27 there is a further A block domain 26' surrounding the B block domain 27. This domain 26' consists of A blocks which are in contact with the side-walls 22a of the recess 22. The A blocks, due to their affinity with the side-walls 22a tend to flatten against the side-walls 22a. As such, the domain 26' may not appear as a separate domain and is shown for schematic purposes only. That is, the thickness of the domain 26' in the lateral direction (i.e. the distance it extends from the side-wall 22a) is minimal. The thickness of the domain 26' in the lateral direction may, for example, be a few nm (e.g. around 4 nm).

In addition to the self-assembly during the annealing step, the acid molecules 23 within the photo-resist layer 21 gradually diffuse into the BCP layer 24 from the side-walls 22a. The gradual diffusion of the acid molecules 23 into the BCP layer 24 causes the cross-linking to occur in a directional manner. In more detail, the elevated temperature during the anneal step (which allows the BCP to self-assemble) increases the mobility of the acid molecules 23 within the BCP layer 24. The diffusion rate of the acid molecules 23 at ambient temperatures may be sufficiently low that no polymerisation occurs within the BCP, in spite of the high concentration of free acid molecules 23 within the photo-resist layer 21 (and consequent high concentration gradient between the photo-resist layer 21 and the BCP layer 24). However, at the elevated temperatures during the anneal step the concentration gradient and increased mobility of the acid molecules 23 leads to significant diffusion.

The diffusion of the acid molecules 23 into the BCP layer 24 causes the glycidyl moieties within the BCP around the perimeter of the recess 22 to undergo the acid catalysed polymerisation reaction described above. This causes the PS blocks within the BCP around the perimeter of the recess 22 to be cross-linked. FIG. 3C shows a small number of the glycidyl moieties within the BCP around the perimeter of the recess 22 being polymerised (i.e. a small number of the PS blocks around the perimeter of the recess 22 being cross-linked).

The cross-linking between the PS blocks causes the PS blocks to become mechanically restricted. This has the effect of reducing the length of the PS blocks which are free to move so as to adapt different conformations. This increases the effective spring constant $K_{spring}$ as described above with reference to Equation (1). The increased spring constant causes an effective stiffening in the springs which control the placement of the A block domain 26. This spring thus stiffening results in a reduction of the placement error of the A block domain 26.

The effect of the cross-linking can further be understood by imagining the B block domain 27 gradually stiffening as the PS blocks within it become more cross-linked. This PS block cross-linking causes a general increase of the stiffness of the B block domain 27, which restricts the movement of the cylindrical A block domain 26.

Figure 3D:
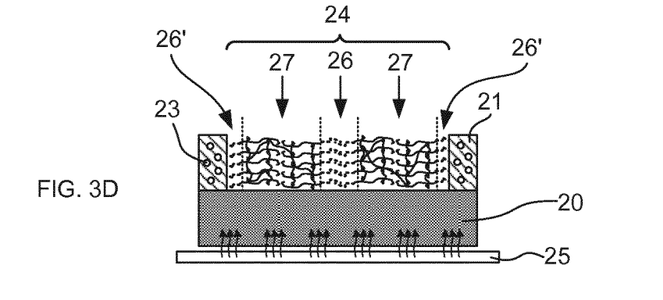

As the annealing process continues, the acid molecules 23 will gradually diffuse further into the BCP layer 24 within the recess 22, driven by the acid concentration gradient. As the acid molecules 23 diffuse further into the BCP layer more glycidyl moieties are caused to polymerise, and more BCP to become cross-linked. FIG. 3D shows a high proportion of the glycidyl moieties within the PS blocks being cross-linked.

The acid eventually diffuses to the centre of the recess 22, by which time glycidyl moieties throughout the PS blocks have become polymerised. The polymerisation of the glycidyl moieties initially around the perimeter of the recess 22, and then gradually towards the centre of the recess 22, is an example of cross-linking in a directional manner.

The slow diffusion rate of the acid within the anneal step, and resulting slow rate of PS cross-linking, coupled with the increased mobility of the BCP (due to the elevated temperature) allows the BCP to adapt to the gradually increasing stiffness caused by the cross-linking. The gradual diffusion of the acid from the perimeter of the recess towards the centre thus allows the BCP blocks to alter their conformation so as to result in a placement of the cylindrical A block domains being accurately positioned within the recesses 22. The placement errors described above with reference to FIGS. 1D and 1E are thus reduced by the use of cross-linking within the BCPs.

An alternative embodiment is illustrated in FIG. 4. FIG. 4A shows in cross-section a substrate 30 which is provided with a recess 31. The recess 31 is patterned into the surface of the substrate 30. The recess 31 has side-walls 31a and a base 31b. The recess 31 is circular. The substrate may, for example, be a silicon wafer. The recess 31 may be etched into the surface of the silicon wafer. Alternatively, the recess 31 may be etched into a layer which is provided on the surface of the substrate 30, for example silicon oxide, or silicon nitride.

Figures 4A, 4B, 4C:
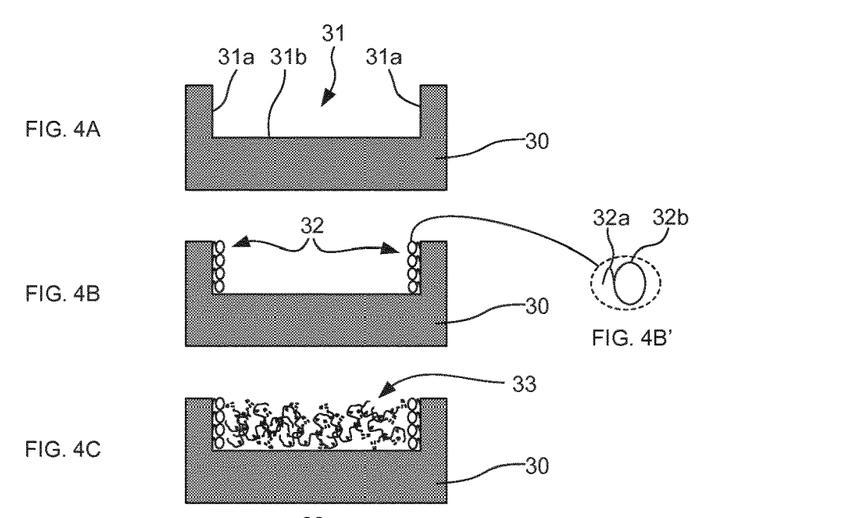
FIGS. 4A-4F schematically depict directed self-assembly of A-B block copolymers onto a substrate by graphoepitaxy according to an alternative embodiment of the invention.

In FIG. 4B, a photosensitive layer 32 of material containing a photo-acid-generator is attached to the side-walls 31a of the recess. FIG. 4B' shows schematically a molecule of material which forms the photosensitive layer 32. Each molecule of the material within the photosensitive layer 32 comprises a binding group 32a which binds to the side-walls 31a and a photosensitive group 32b. Suitable materials having a photosensitive part and a surface active part are described in US 2007/0278179, which is herein incorporated by reference. For example, the binding groups may be chloro or alkoxy silanes which bind to silicon oxides surfaces (paragraph [0037]). In an alternative example, the binding groups may be dienes, alcohols or aldehydes which bind to silicon surfaces (paragraph [0038]). The photosensitive group 32b, when activated by actinic radiation, produces an acid. The photosensitive group 32b may be referred to as a photo-acid-generator (PAG).

In FIG. 4C, a self-assemblable A-B block copolymer (BCP) layer 33 has been deposited onto the substrate 30. The self-assemblable A-B block copolymer is a modified PS-b-PMMA which may be referred to as PS/PGMA-b-PMMA, as described above with reference to FIG. 3.

Figure 4D:
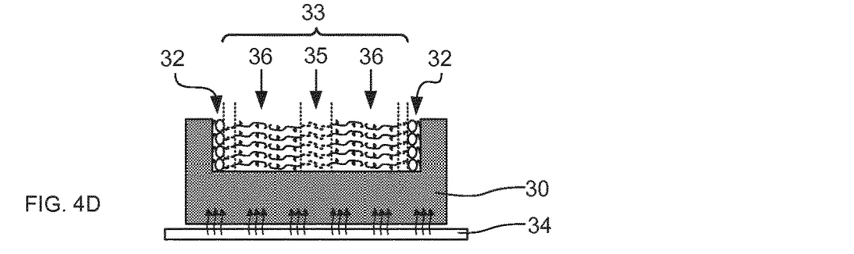

In FIG. 4D, the BCP layer 33 has been thermally annealed on a hotplate 34. The thermal annealing process causes self-assembly of the BCP material in a similar process to that described above with reference to FIGS. 1 to 3. As can be seen within the recess 31, the BCP material self-assembles to form a domain of A blocks 35 and a domain of B blocks 36. The A block domain 35 is in a cylindrical arrangement, being surrounded by a continuous the B block domain 36. The cylindrical A block domain 35 is oriented perpendicular to the substrate 30. The photosensitive layer 32 remains inactive during the annealing and self-assembly process.

Figure 4E:
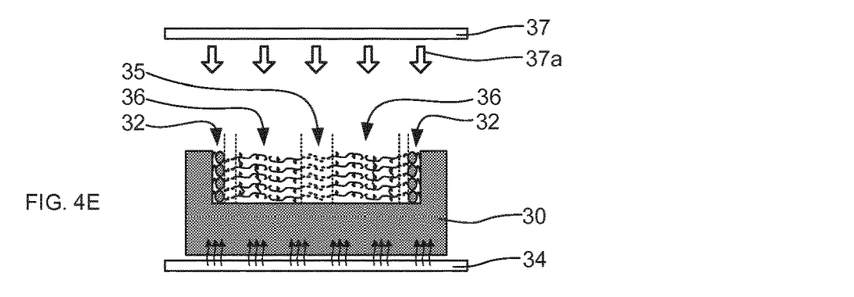

In FIG. 4E, a radiation source 37 is provided above the substrate 30. The radiation source may be any suitable form of radiation source. For example, the radiation source may be a UV lamp, a laser, an LED or an LED array. Once the self-assembly of the BCP layer 33 is complete the substrate 30 is exposed to actinic radiation 37a emitted by the radiation source 37. The actinic radiation 37a activates the photosensitive layer 32. The PAG within the photo-sensitive layer 32 generates an acid, which diffuses into the self-assembled BCP layer 33. The acid causes the glycidyl moieties within the B block domain 36 to begin to polymerise. The polymerisation causes cross-linking between the PS blocks within the B block domain 36. This cross-linking process is similar to that described above with reference to FIG. 3.

However, in contrast to the process described with reference to FIG. 3, the acid is generated by the photosensitive layer 32 which is attached to the side-walls 31a of the recess 31, rather than being provided within a resist layer (which is not present in FIG. 4). While the origin of the acid differs between the processes shown in FIGS. 3 and 4, the acid is still provided initially at the perimeter of the recess 31, before diffusing towards the centre of the recess 31. This diffusion results in the polymerisation reaction, and resulting cross-linking, proceeding in a similar fashion for both methods (i.e. from the perimeter towards the centre).

Figure 4F:
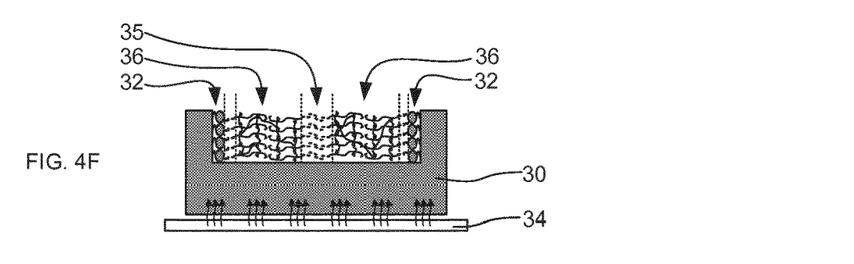

FIG. 4F shows a high proportion of the glycidyl moieties within the PS blocks being cross-linked. The acid eventually diffuses to the centre of the recess 31, by which time all of the glycidyl moieties within the PS blocks have become polymerised. This causes the central A block domain 35 to be accurately positioned at the centre of the recess 31.

It will be appreciated that the photosensitive layer 32, when attached to the side-walls 31a of the recess 31, may also be attached to the base 31b of recess 31. For example, the binding group may bind well to both the side-walls 31a and the base 31b and as such may become attached to both surfaces during an application process. However, while a small amount of acid may be generated at the base 31b of the recess 31 as a result of any subsequent exposure to radiation, this does not affect the progression of the cross-linking from the side-walls towards the centre of the recess 31. It is understood that this is a result of the quantity of acid generated at the base 31b of the recess 31 being significantly less than that which is generated at the side-walls 31a, the side-walls having a larger surface area than the base.

Alternatively, the layer 32 may be arranged to selectively attach to only the side-walls 31a, and not to the base 31b. For example, the base may be formed from a different material to the side-walls, or provided with a coating to which the layer 32 does not attach. In an embodiment, the side-walls may be formed from silicon, and the base formed from a metallic or organic material. The layer 32 may comprise a silane binding group which preferentially binds to the silicon side-walls, and not to the metallic or organic base.

It will be appreciated that the presence of a layer comprising a photosensitive group (e.g. layer 32) does not prevent the successful directed self-assembly of BCP within a recess. The side-wall surfaces, once coated with the layer comprising a photosensitive group, are preferably not neutral with respect to the BCP blocks. For example, where a PS-b-PMMA BCP is used, the coated side-wall surfaces are preferably either PS wetting or PMMA wetting, allowing self-assembly to be driven by the relative affinities of the PS and PMMA blocks for the side-walls, for themselves, and for each other.

Figure 5:
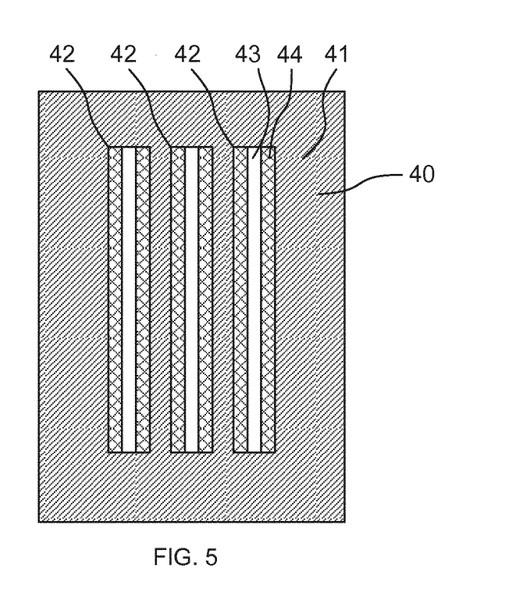
FIG. 5 is a schematic representation of a substrate on which graphoepitaxy according to an alternative embodiment of the invention has been performed.

Alternative lithography recess geometries are possible beyond the circular examples discussed above. For example, FIG. 5 shows a substrate 40 provided with a photo-resist layer 41 in which linear lithography recesses 42 are defined. BCP material within the recesses 42 has self-assembled to form discrete A block domains 43 and B block domains 44. In contrast to the earlier embodiments, the A block domains 43 and B block domains 44 within the lithography recesses 42 are shown in a lamellar arrangement. The elongate arrangement of recesses 42 guides the self-assembly of the BCP to form B-block domains 44 at the edges of the recesses 42 with a single respective A-block domain 43 running along the centre of each of the elongate recesses 42. The lamellae of the A-block and B-block domains 43, 44 are orientated with their planar surfaces lying perpendicular to the substrate 40 and parallel to the recess walls. Alternatively, there may be a plurality of A-block domains which are lamellae alternating with B-block domains which are also lamellae.

The cross-linking process described above with reference to FIGS. 2-4 may be applied to elongate recesses, such as those illustrated in FIG. 5, in order to improve the placement of the self-assembled lithography features. For example, the A block domains 43 may be accurately positioned at the centre of the lithography recesses 42 by the action of an acid diffusing from the sidewalls towards the centre of the recesses 42, causing the BCP material to become cross-linked.

Further alternative lithography recess geometries are possible beyond the circular and elongate examples discussed above. Any recess geometry which promotes self-assembly of BCP may be used for a lithography recess. In any such alternative geometry, the cross-linking process described above may be applied in order to improve the placement of the self-assembled lithography features.

In general the dimensions of recesses for use with directed self-assembly of BCPs varies in dependence upon the particular BCP selected. For example, the length of the BCP polymer chains affects the recess dimensions at which phase separation and self-assembly occurs. A shorter length polymer chain is likely to result in a recess with a smaller dimension being suitable to direct self-assembly of that polymer chain.

In an embodiment the recesses formed on a substrate may have a lateral dimension of less than about 100 nm. The recesses may have a lateral dimension of greater than about 30 nm. If smaller recess dimensions are used than will permit phase separation to occur then the BCP within a recess will not self-assemble.

A dimension of the lithography features (e.g. the A block domains 14; 26; 35; 43) formed according to embodiments of the invention may be less than about 40 nm. For example, a dimension of the lithography features formed (e.g. A block domains) may be greater than about 5 nm.

It will be appreciated that in alternative embodiments different arrangements of polymer domains may be used. For example, in an alternative embodiment which uses the same A-B block copolymer described above (PS-b-PMMA), B blocks (e.g. PS) may preferably lie adjacent to the side-walls due to their affinity with the side-walls, while the A blocks (e.g. PMMA) form a central cylindrical domain.

It will be appreciated that the use of resist (also known as photo-resist) to form the sidewalls of the lithography recesses is intended to be an example, rather than a limiting feature. For example, recesses may be provided by patterning of the substrate itself (for example as described with reference to FIG. 4), or patterning of a layer deposited or grown onto the substrate. Alternatively, recesses may themselves be provided by the self-assembly of a BCP material.

It will be appreciated that initiating cross-linking at recess side-walls is one way of providing cross-linking in a directional manner. However, alternative directional cross-linking processes may be used. For example, an acid may be provided on a surface of recess base at a predetermined location (for example by the inclusion of a PAG at the predetermined location), causing cross-linking to be initiated at the predetermined location and proceed away from the predetermined location.

In an embodiment a lithographic tool is arranged carry out annealing of the substrate while also providing radiation, for example, as shown in FIG. 4E. The hot plate 34 is an example of heat source which is arranged to provide heat (to anneal the substrate 30) while the radiation source 37 provides radiation 37a (to initiate cross linking of the BCP layer 33). The heat source may be arranged provide thermal energy to a first surface of the substrate at the same time as the radiation source provides radiation to a second surface of the substrate.

A lithographic tool as described above may be provided on a wafer track within a semiconductor fabrication plant. For example, the lithographic tool may be integrated in to a wafer track which also serves to transport a wafer between lithography apparatus.

The radiation source may be arranged to emit actinic radiation, for example UV radiation. Alternatively, the radiation source may be arranged to emit EUV or DUV radiation. The radiation source may irradiate the substrate with a flood exposure i.e. a radiation beam which is not patterned. The use of a non-patterned radiation beam allows any photo-acid generator provided on a substrate surface to be activated. The wavelength of radiation provided in a flood exposure does not determine the minimum feature size which can be formed by processes as described above. Therefore, a flood exposure does not require the use of radiation with an extremely short wavelength (e.g. EUV), as no pattern information is required to be transferred by the exposure.

The invention claimed is:

1. A method of forming at least one lithography feature, the method comprising:
   providing at least one lithography recess on a substrate, the or each lithography recess comprising at least one side-wall made of resist and a base, with the at least one side-wall having a width between portions thereof and the providing the lithography recess comprising performing a lithography exposure of the resist with radiation to activate a photo-acid generator in the resist and then developing the resist to form the at least one lithography recess;
   providing a self-assemblable block copolymer having first and second blocks in the or each lithography recess;
   causing the self-assemblable block copolymer to self-assemble into an ordered layer within the or each lithography recess, the ordered layer comprising at least a first domain of first blocks and a second domain of second blocks;
   heating the previously lithography exposed and developed resist to a temperature sufficient to cause diffusion of acid from the resist into the self-assemblable block copolymer when otherwise the acid would effectively not diffuse into the self-assemblable block copolymer and/or further exposing the previously lithography exposed and developed resist to radiation;
   causing, by acid from the heated and/or further exposed resist, the self-assemblable block copolymer to cross-link in a directional manner; and
   selectively removing the first domain to form lithography features comprised of the second domain within the or each lithography recess.

2. The method according to claim 1, wherein the cross-linking is initiated at the at least one side-wall and proceeds away from the at least one sidewall.

3. The method according to claim 1, comprising the heating of the previously lithography exposed and developed resist and wherein causing the self-assemblable block copolymer to cross-link takes place during the heating.

4. The method according to claim 1, wherein the block copolymer comprises polystyrene blocks and glycidyl moieties.

5. The method according to claim 4, wherein the polystyrene blocks comprise more than about 0.1% by weight of glycidyl moieties.

6. The method according to claim 4, wherein the polystyrene blocks comprise less than about 10% by weight of glycidyl moieties.

7. The method according to claim 1, wherein the acid is generated by the photo-acid generator.

8. The method according to claim 7, wherein the acid is at least partially generated by the photo-acid generator during the lithography exposure.

9. The method according to claim 7, comprising the further exposing of the previously lithography exposed and developed resist to radiation, wherein the further exposing comprises a flood exposure, and wherein acid is at least partially generated by a photo-acid generator during the flood exposure.

10. A method of forming at least one lithography feature on a substrate, the substrate comprising at least one lithography recess, the or each lithography recess comprising at least one side-wall and a base, with the at least one side-wall having a width between portions thereof, the method comprising:
providing a self-assemblable block copolymer having first and second blocks in the or each lithography recess;
causing the self-assemblable block copolymer to self-assemble into an ordered layer within the or each lithography recess, the ordered layer comprising at least a first domain of first blocks and a second domain of second blocks;
providing, from the at least one side-wall and/or the base of the or each lithography recess against which the self-assemblable block copolymer rests, a material to interact with the self-assemblable block copolymer to cause the self-assemblable block copolymer to cross-link in a directional manner, wherein the material, at a time of self-assembly of the self-assemblable block copolymer, makes up about 1% or more by weight of such at least one side-wall and/or base; and
selectively removing the first domain to form lithography features comprised of the second domain within the or each lithography recess.

11. A method of forming at least one lithography feature on a substrate, the substrate comprising at least one lithography recess, the or each lithography recess comprising at least one side-wall and a base, with the at least one side-wall having a width between portions thereof, the method comprising:
providing a self-assemblable block copolymer having first and second blocks in the or each lithography recess;
causing the self-assemblable block copolymer to self-assemble into an ordered layer within the or each lithography recess, the ordered layer comprising at least a first domain of first blocks and a second domain of second blocks; and
providing, from a surface of the at least one side-wall and/or the base of the or each lithography recess against which the self-assemblable block copolymer rests, a material to interact with the self-assemblable block copolymer to cause the self-assemblable block copolymer to cross-link in a directional manner, wherein the at least one side-wall and/or the base having the surface is formed of a material different than the material to interact with the self-assemblable block copolymer to cause the self-assemblable block copolymer to cross-link or different than a material containing the material to interact with the self-assemblable block copolymer to cause the self-assemblable block copolymer to cross-link.

12. The method according to claim 11, wherein the cross-linking is initiated at the at least one side-wall and proceeds away from the at least one sidewall.

13. The method according to claim 11, wherein the block copolymer comprises polystyrene blocks and glycidyl moieties.

14. The method according to claim 13, wherein the polystyrene blocks comprise more than about 0.1% by weight of glycidyl moieties.

15. The method according to claim 13, wherein the polystyrene blocks comprise less than about 10% by weight of glycidyl moieties.

16. The method according to claim 10, wherein the cross-linking is initiated at the at least one side-wall and proceeds away from the at least one sidewall.

17. The method according to claim 10, wherein the providing of the material takes place during a heating of the at least one side-wall and/or the base of the or each lithography recess.

18. The method according to claim 10, wherein the at least one side-wall and/or the base of the or each lithography recess was formed by an exposure and development process and comprising further exposing the or each previously exposed and developed lithography recess to radiation.

19. The method according to claim 10, wherein the block copolymer comprises polystyrene blocks and glycidyl moieties.

20. The method according to claim 10, wherein the material is acid in a resist forming the at least one side-wall and/or the base of the or each lithography recess.

\* \* \* \* \*